United States Patent [19]

Seitel et al.

[11] Patent Number: 4,597,639
[45] Date of Patent: Jul. 1, 1986

[54] DIELECTRIC AIR-INTERFACE PLASMA OPTICAL POWER LIMITER

[75] Inventors: Steven C. Seitel; C. Denton Marrs, both of Ridgecrest, Calif.

[73] Assignee: The United States of America as represented by the Secretary of the Navy, Washington, D.C.

[21] Appl. No.: 607,981

[22] Filed: May 7, 1984

[51] Int. Cl.⁴ .............................................. G02F 1/00
[52] U.S. Cl. ..................................... 350/363; 350/393
[58] Field of Search ................ 427/166; 350/354, 363, 350/393

[56] References Cited

U.S. PATENT DOCUMENTS

| 3,597,046 | 8/1971 | Smithgall | 350/164 |
|---|---|---|---|
| 3,604,778 | 9/1971 | Burckhardt | 350/3.5 |
| 3,734,592 | 5/1973 | Sztankay et al. | 350/17 |
| 3,781,089 | 12/1973 | Fay et al. | 350/164 |
| 3,883,232 | 5/1975 | Tsunoda | 350/314 |
| 3,936,579 | 2/1976 | Ogasawara et al. | 428/432 |
| 3,995,948 | 12/1976 | Abe et al. | 350/3.5 |
| 4,168,339 | 9/1979 | Kerko et al. | 428/220 |
| 4,225,211 | 9/1980 | Abe | 350/3.82 |

Primary Examiner—John D. Smith
Assistant Examiner—K. Jaconetty
Attorney, Agent, or Firm—Robert F. Beers; W. Thom Skeer; Stephen J. Church

[57] ABSTRACT

Optical devices which reduce the risk of damage by high energy laser pulses are made by applying particles to the surface of optical components. The particles serve as plasma initiation sites. The particles are made of material capable of producing large numbers of free electrons when illuminated above a preselected power level. Above the preselected power level, transmittance or reflectance of the optical component is limited by the plasma created by the free electrons.

8 Claims, 8 Drawing Figures

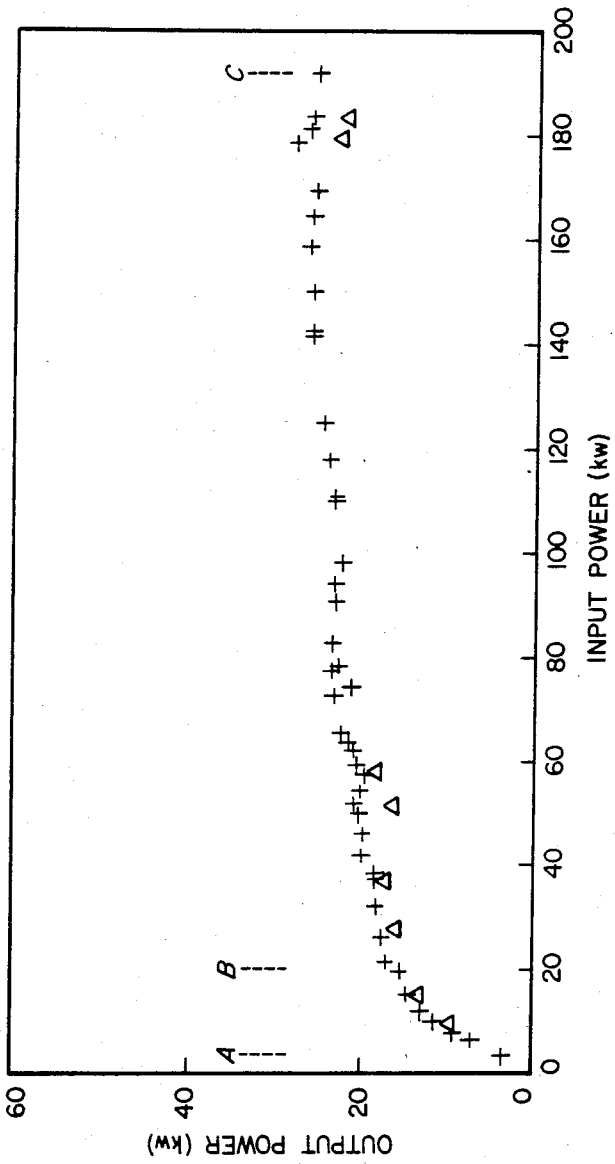

DIELECTRIC AIR-INTERFACE PLASMA OPTICAL POWER LIMITER

BACKGROUND OF THE INVENTION

1. Field of the Invention

The present invention is a device for limiting the power or energy output of a laser system. In particular, the present invention relates to devices which create a plasma to shield sensitive components of laser systems from high energy laser bursts.

2. Description of the Prior Art

It is known that plasmas attenuate laser beams that are incident on the plasmas. The surfaces of optical components create plasmas when subject to high energy lasers. The damage to the surface depends on the intensity of the energy transmitted or reflected. In creating these plasmas, the optical surface is damaged and permanent, usually severe, degradation of the surface has already occurred before the plasma effect can limit further laser damage. No device, which creates such a plasma without first having degradation of the optical component surface occur, is known.

SUMMARY OF THE INVENTION

A dielectric air-interface plasma optical power limiter is made by placing a plurality of plasma initiation sites on the surface of an optical component, such as a mirror or lens. The sites are particles of a material that emits large numbers of free electrons above a threshold power level. The sites are placed on the surface by vapor deposition or any other manner. For some materials, a natural tendency of the material to adhere to the surface is sufficient. The sites are small speckles on the surface and do not form a uniform coating of the surface. Most of the surface area of the optical component is uncovered.

BRIEF DESCRIPTION OF THE DRAWINGS

FIG. 8 is a typical graph of output power versus input power for the present invention.

DETAILED DESCRIPTION OF THE INVENTION

Figure 1:
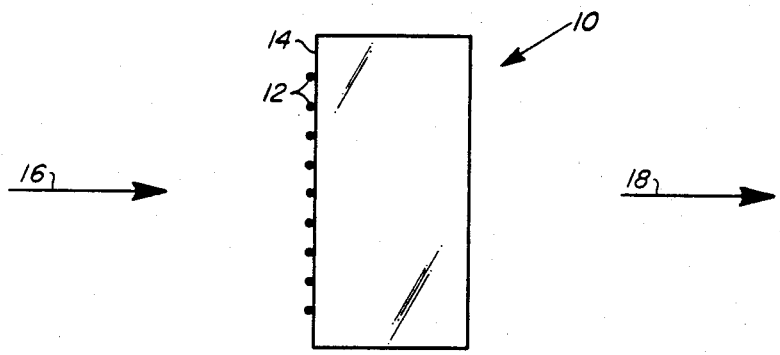
FIG. 1 is a side view of light passing through a form of the present invention suitable for use as a transmissive optical element.

FIG. 1 is a side view of one embodiment of the present invention. An optical component 10, which may be a mirror or a transmissive element has a plurality of plasma initiation sites 12 on its exterior surface 14. Optical component 10 is a transmissive element as shown in FIG. 1. For a transmissive element, incident radiation 16 passes through and exits as transmitted radiation 18. As shown, optical component 10 may be a dielectric plate which is a transparent substrate with respect to incident radiation 16. The use of a dielectric to attenuate excessive laser energy works well for systems which do not require optical imagery. Exterior surface 14 is usually polished and if the material of optical component 10 is not transparent then exterior surface 14 serves as the reflecting surface of a mirror. All of the discussion of the present device as a transmitting element is equally true for a reflecting surface. Transmitted radiation just becomes reflected radiation. The transmitting embodiment of the device is illustrated for clarity because incident radiation 16 and transmitted radiation 18 do not overlap. Reflected radiation overlaps a portion of incident radiation due to the diameter of the laser beam. Incident radiation 16 is emitted by a laser system, not shown, and may be focused or directed by an optical train, also not shown, prior to being incident on surface 14.

Figure 2:
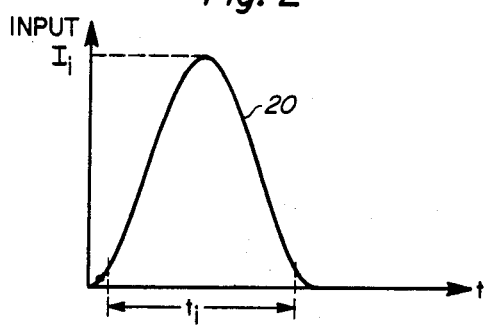
FIG. 2 is a graph of intensity versus time for a typical laser pulse.
Figure 3:
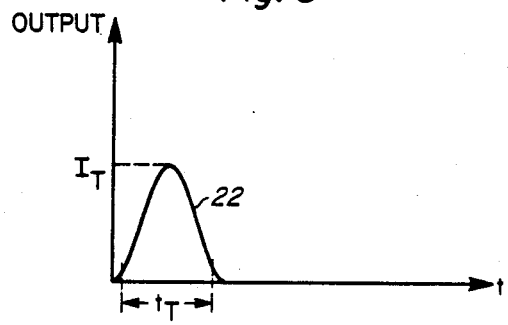
FIG. 3 is a graph of the same laser pulse as in FIG. 2 after passing through the present invention as shown in FIG. 1.

FIG. 2 is a graph of intensity versus time for a typical laser pulse. Incident pulse 20 has a peak intensity $I_i$ and pulse duration $t_i$. FIG. 3 is a graph of intensity versus time for the pulse of FIG. 2 after passing through transmissive element. Transmitted pulse 22 has peak intensity $I_T$ and pulse duration $t_T$. Due to loss through any transmissive element or off any mirror, $I_T$ is at least slightly less than $I_i$.

Plasma initiation sites 12 in FIG. 1 are speckled on exterior surface 14. They may be speckled on in a random manner or systematically spaced. They do not form a uniform coating of exterior surface 14. Surface 14 is described as "exterior" because it is exposed to and interfaces with an atmosphere, such as air, while being illuminated by incident radiation 16. An atmosphere is needed to create the plasma. The free electrons from sites 12 ionize the atmosphere near surface 14, thus, producing the shielding plasma. In a sealed system, the atmosphere may be any gas desired. However, ambient air is acceptable and avoids the expense of sealed systems. Sites 12 may be particles of any material that emits large numbers of free electrons when illuminated above an optical breakdown threshold. The particles may be naturally adherent to surface 14 or they may be placed by any well known method, such as vapor deposition. Most of surface 14's surface area is not covered by sites 12. There is no requirement that a specific percentage of the surface area be exposed or covered. Materials that may serve as plasma initiation sites 12 include sodium fluoride, NaF, lead fluoride $PbF_2$, lanthanum hexaboride, $LaB_6$, silicon, S, or any combination of these materials.

Figure 4:
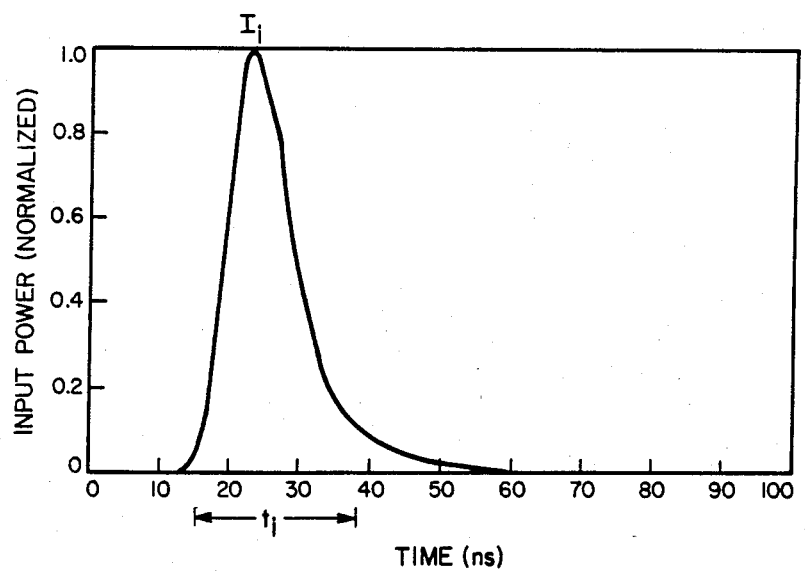
FIG. 4 is a graph of input power versus time for an incident wave at an air-dielectric interface when the incident power is just above the optical breakdown threshold.

FIG. 4 is a graph similar to FIG. 2 where curve 20 has a peak $I_i$ which is just above the optical breakdown threshold for plasma initiation sites 12. For purposes of example only, assume sites 12 are composed of a material which breaks down at 89 kW and assume $I_i$ is 90 kW. The input power is normalized for reference. The time $t_i$ is set at 25 ns, which varies for a given pulse source.

Figure 5:
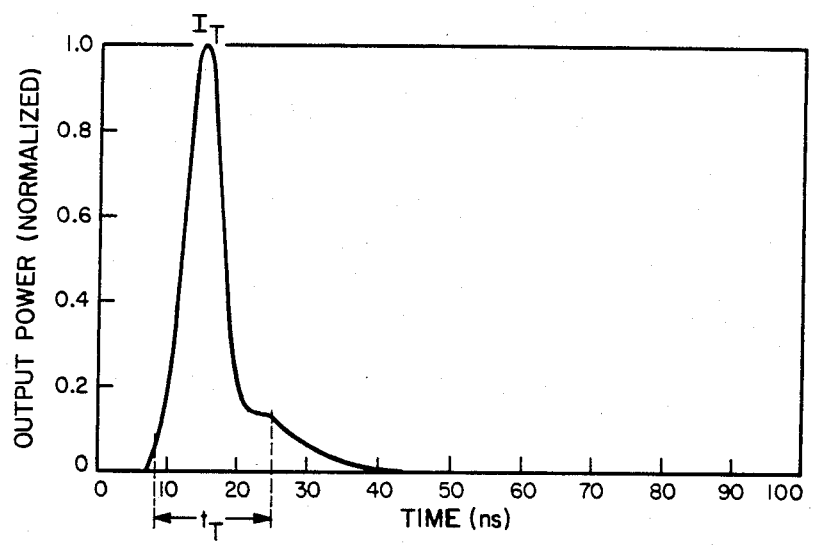
FIG. 5 is a graph of the same wave as FIG. 4 but after it has been transmitted through a lens of the present invention.

FIG. 5 is the graph similar to FIG. 3 where curve 20 has a reduced transmitted fluence shown by $t_T$ being significantly lss than $t_i$. The transmitted peak $I_T$ is very close to $I_i$ and the peak transmitted power is not affected.

Figure 6:
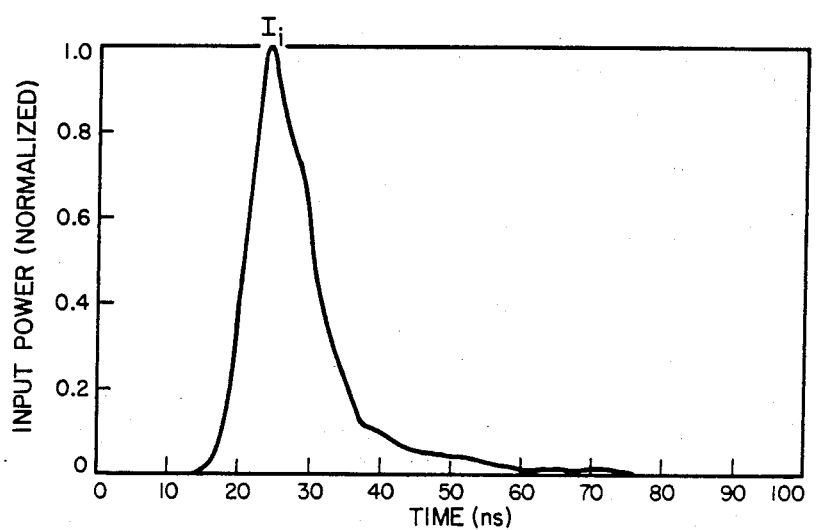
FIG. 6 is a graph similar to FIG. 4 but for incident power well above the optical breakdown threshold.
Figure 7:
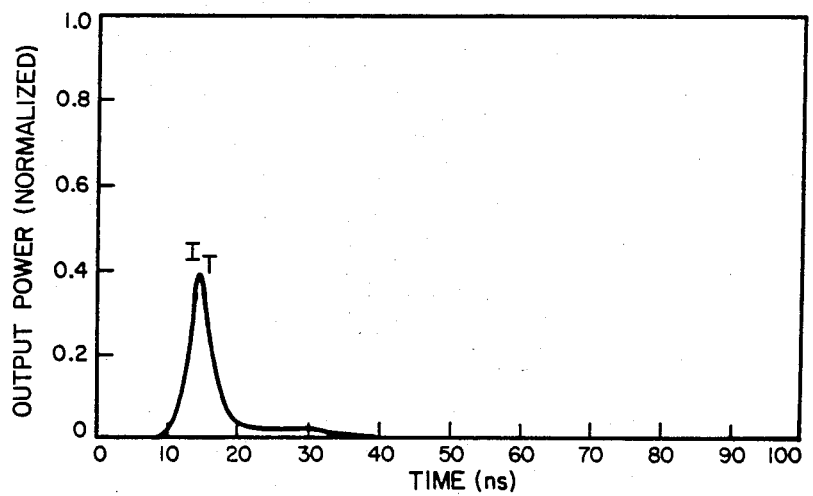
FIG. 7 is a graph of the transmited waveform of FIG. 6 through a lens of the present invention.

FIG. 6 and FIG. 7 correspond to FIG. 4 and FIG. 5 respectively. The difference is due to the increased value of $I_i$. Assume $I_i$ is 298 kW, which is well above the breakdown threshold. The comparable peak $I_T$, in FIG. 7 is reduced by 60% of its normalized value. $I_T$ is approximately 125 kW.

The plasma initiation sites are intentional pollutants. They serve as preferred sources of plasma. An unpolluted optical surface eventually creates a plasma which limits further transmission. However the creation of a plasma from the surface requires permanent pitting and erosion of the surface. If sites 12 are consumed first, the useful life of the optical component is extended by the life of the sites. A comparison of FIGS. 4-7 shows that creation of plasma shield provides nanosecond response time. Sites 12 are frequently reform on the surface; although in new locations. Thus, they are reused and subject to a very low attrition rate. Since, optical component 10 in FIG. 1 has most of its surface area of surface 14 available for focusing incident radiation 16, sites 12 may be placed in a random or systematic manner without significant impact on transmitted radiation 19.

FIG. 8 is a graph of output power versus input power for lead fluoride, $PbF_2$, plasma initiation sites on a calcium fluoride, $CaF_2$, dielectric with incident radiation of 1.06 m. The response is linear in the A-B region. At B, the optical breakdown threshold occurs and almost all additional input power is shielded. For different materials and/or wavelength of incident radiation, similar relations exist. The limits on the A-B region will vary as well as the effectiveness of the shield above the breakdown threshold. The threshold may be controlled by the proper choice of material for plasma initiation sites.

To those skilled in the art, numerous modification to the above are obvious.

What is claimed is:

1. A device for limiting laser energy or power transmittal comprising:

a dielectric plate in the path of received laser energy, one surface of said dielectric plate being exposed to the atmosphere; and a plurality of plasma initiation sites applied to said exposed surface, said sites being particles chosen from the group consisting of
   sodium fluoride, lead fluoride, lanthanum hexaboride, silicon, or any combination thereof.

2. A device for limiting laser energy or power reflectance comprising:

a mirror surface in the path of received laser energy, said mirror surface being exposed to the atmosphere; and a plurality of plasma initiation sites applied to said mirror surface, said sites being particles chosen from the group consisting of
   sodium fluoride, lead fluoride, silicon, lanthanum hexaboride, or any combination thereof.

3. An optical radiation attenuating device comprising:

an optical component having an exterior surface disposed for inpingment of such radiation; and a plurality of particles disposed on said surface in speckled relation, said particles being of a material which emits electrons when the power of such radiation is above an optical breakdown threshold.

4. The device of claim 3 wherein most of the area of said surface is not covered by said particles.

5. The device of claim 3 further comprising gaseous means interfacing said surface and said particles for ionization by said electrons to generate a plasma which attenuates such radiation impinging on said surface.

6. The device of claim 3 wherein said optical component transmits such radiation impinging on said surface.

7. The device of claim 3 wherein such radiation impinging on said surface is reflected therefrom.

8. The device of claim 3 wherein said material is chosen from the group consisting of sodium fluoride, lead fluoride, lanthanum hexaboride, silicon, or any combination thereof.

* * * * *